(12) United States Patent
Obata

(10) Patent No.: US 12,170,423 B2
(45) Date of Patent: Dec. 17, 2024

(54) CONNECTOR STRUCTURE AND CONNECTOR

(71) Applicant: Murata Manufacturing Co., Ltd., Kyoto (JP)

(72) Inventor: Takayoshi Obata, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 323 days.

(21) Appl. No.: 17/454,893

(22) Filed: Nov. 15, 2021

(65) Prior Publication Data
US 2022/0077631 A1     Mar. 10, 2022

Related U.S. Application Data

(63) Continuation of application No. PCT/JP2020/019614, filed on May 18, 2020.

(30) Foreign Application Priority Data

May 24, 2019   (JP) .................. 2019-097672

(51) Int. Cl.
*H01R 13/631*   (2006.01)
*H01R 12/70*    (2011.01)
(Continued)

(52) U.S. Cl.
CPC ......... *H01R 13/631* (2013.01); *H01R 12/774* (2013.01); *H05K 1/118* (2013.01);
(Continued)

(58) Field of Classification Search
CPC .... H01R 13/631; H01R 12/774; H01R 12/88; H05K 1/118; H05K 2201/09063; H05K 2201/2009
See application file for complete search history.

(56) References Cited

U.S. PATENT DOCUMENTS

| | | | |
|---|---|---|---|
| 6,010,359 A | 1/2000 | Etters et al. | |
| 6,089,905 A * | 7/2000 | Shimmyo | H01R 12/79 439/495 |
| 9,559,449 B2 * | 1/2017 | Ishida | H01R 12/77 |

FOREIGN PATENT DOCUMENTS

| | | |
|---|---|---|
| JP | H06-188047 A | 7/1994 |
| JP | 2000-36340 A | 2/2000 |

(Continued)

OTHER PUBLICATIONS

International Search Report issued in Application No. PCT/JP2020/019614, dated Jul. 14, 2020.
(Continued)

*Primary Examiner* — Briggitte R. Hammond
(74) *Attorney, Agent, or Firm* — Pearne & Gordon LLP

(57) ABSTRACT

A connector structure (1) includes a connector (100) and a flexible printed circuit (200). The connector (100) includes a connector body (110) having a terminal portion (116) and a positioning projection (120) configured to position the flexible printed circuit (200) relative to the connector body (110) so as to bring an electrode portion (222) into contact with the terminal portion (116) at a right position being set in advance. An insertion hole (210*h*) through which the positioning projection (120) is inserted is formed in the flexible printed circuit (200) at a position spaced from the electrode portion (222). As the positioning projection (120) is inserted gradually into the insertion hole (210*h*), the positioning projection (120) moves the flexible printed circuit (200) so that the flexible printed circuit (200) is aligned with the right position.

14 Claims, 14 Drawing Sheets

(51) Int. Cl.
    *H01R 12/77*    (2011.01)
    *H01R 12/88*    (2011.01)
    *H05K 1/11*     (2006.01)

(52) U.S. Cl.
    CPC .......... *H01R 12/7005* (2013.01); *H01R 12/88* (2013.01); *H05K 2201/09063* (2013.01); *H05K 2201/2009* (2013.01)

(56) References Cited

FOREIGN PATENT DOCUMENTS

| | | |
|---|---|---|
| JP | 2000-77122 A | 3/2000 |
| JP | 2002-93503 A | 3/2002 |
| JP | 2004-22414 A | 1/2004 |
| JP | 2004-103517 A | 4/2004 |
| JP | 2006-147294 A | 6/2006 |
| JP | 2013-125704 A | 6/2013 |
| JP | 2015-2094 A | 1/2015 |
| KR | 10-2018-0057844 A | 5/2018 |

OTHER PUBLICATIONS

Written Opinion issued in Application No. PCT/JP2020/019614, dated Jul. 14, 2020.

\* cited by examiner

CONNECTOR STRUCTURE AND CONNECTOR

This is a continuation of International Application No. PCT/JP2020/019614 filed on May 18, 2020 which claims priority from Japanese Patent Application No. JP 2019-097672 filed on May 24, 2019. The contents of these applications are incorporated herein by reference in their entireties.

BACKGROUND OF THE DISCLOSURE

Field of the Disclosure

The present disclosure relates to a connector structure and a connector.

Description of the Related Art

A connector structure for connecting a flexible printed circuit to an electronic device or the like is known. For example, Japanese Unexamined Patent Application Publication No. 2000-77122 (hereinafter referred to as "Patent Document 1") discloses a clip-type relay connector that includes a clip body and a flexible printed circuit. The clip body includes a spacer that positions widthwise edges of the flexible printed circuit, a stopper member that positions the end of the flexible printed circuit in the insertion direction, and a pin-block member that has probes to be brought into contact with a terminal of the flexible printed circuit.
Patent Document 1: Japanese Unexamined Patent Application Publication No. 2000-77122

BRIEF SUMMARY OF THE DISCLOSURE

In the clip-type relay connector disclosed by the Patent Document 1, positioning of the flexible printed circuit with respect to the clip body is the key to appropriate contact of the flexible printed circuit with the clip body at a right position. To achieve appropriate positioning, a high finishing accuracy is required in forming the widthwise edges and the insertion end of the flexible printed circuit.

An object of the present disclosure is to provide a connector structure and a connector that can relax the finishing accuracy requirement of the flexible printed circuit for appropriate positioning of the flexible printed circuit with respect to the connector.

A connector structure according to an aspect of the present disclosure includes a connector having a terminal portion and a flexible printed circuit having an electrode portion to be coupled to the terminal portion. The connector includes a connector body having the terminal portion. The connector also includes a positioning projection configured to position the flexible printed circuit relative to the connector body so as to bring the electrode portion into contact with the terminal portion at a right position being set in advance. An insertion hole through which the positioning projection is inserted is formed in the flexible printed circuit at a position spaced from the electrode portion. As the positioning projection is inserted gradually into the insertion hole, the positioning projection moves the flexible printed circuit so that the flexible printed circuit is aligned with the right position.

A connector according to another aspect of the present disclosure is to be coupled to a flexible printed circuit that has an electrode portion and an insertion hole formed at a position spaced from the electrode portion. The connector includes a connector body having a terminal portion to be coupled to the electrode portion. The connector also includes a positioning projection configured to position the flexible printed circuit relative to the connector body so as to bring the electrode portion into contact with the terminal portion at a right position being set in advance. As the positioning projection is inserted gradually into the insertion hole, the positioning projection moves the flexible printed circuit so that the flexible printed circuit is aligned with the right position.

As described above, the present disclosure provides a connector structure and a connector that can relax the finishing accuracy requirement of the flexible printed circuit for appropriate positioning of the flexible printed circuit with respect to the connector.

DETAILED DESCRIPTION OF THE DISCLOSURE

Figure 1:
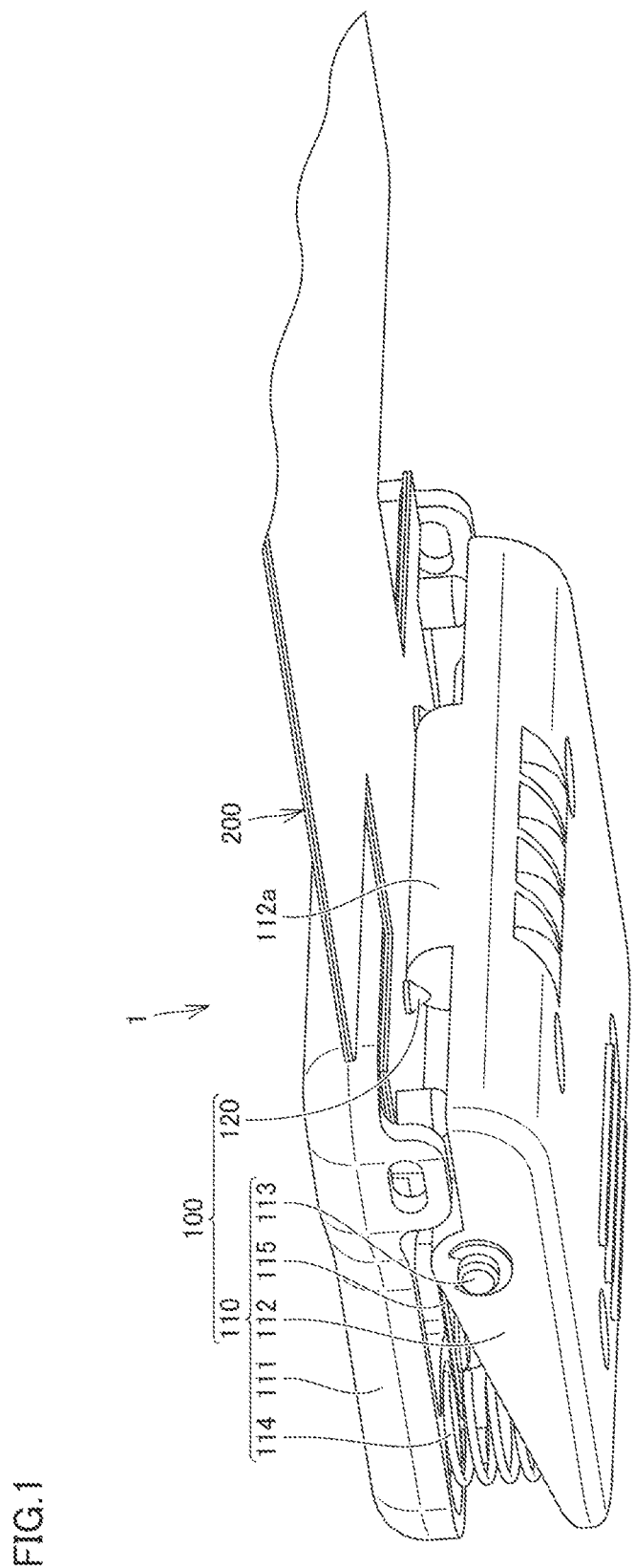
FIG. 1 is a perspective view illustrating a connector body being at a nipping position in a connector structure according to one embodiment of the present disclosure.

An embodiment of the present disclosure will be described with reference to the drawings. Note that the same or equivalent elements are denoted by the same reference signs in the drawings for reference.

Figure 2:
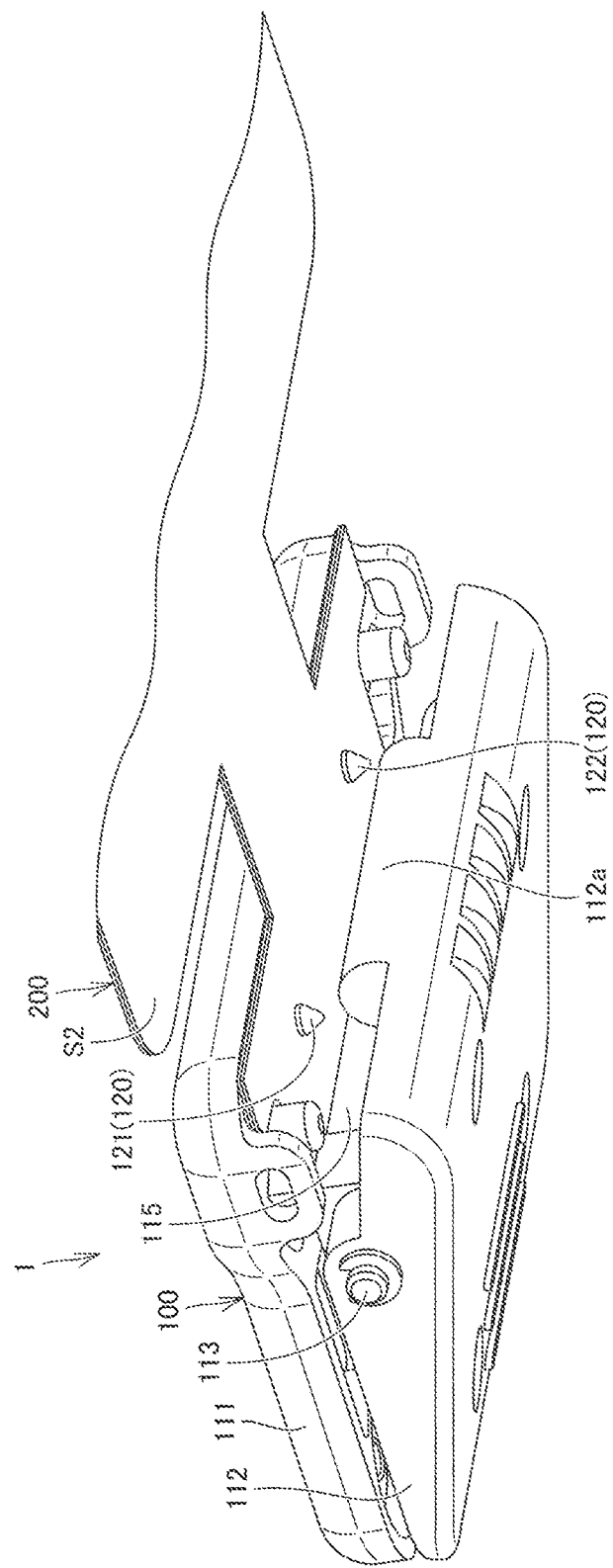
FIG. 2 is a perspective view illustrating the connector body being at a releasing position in the connector structure of FIG. 1.
Figure 3:
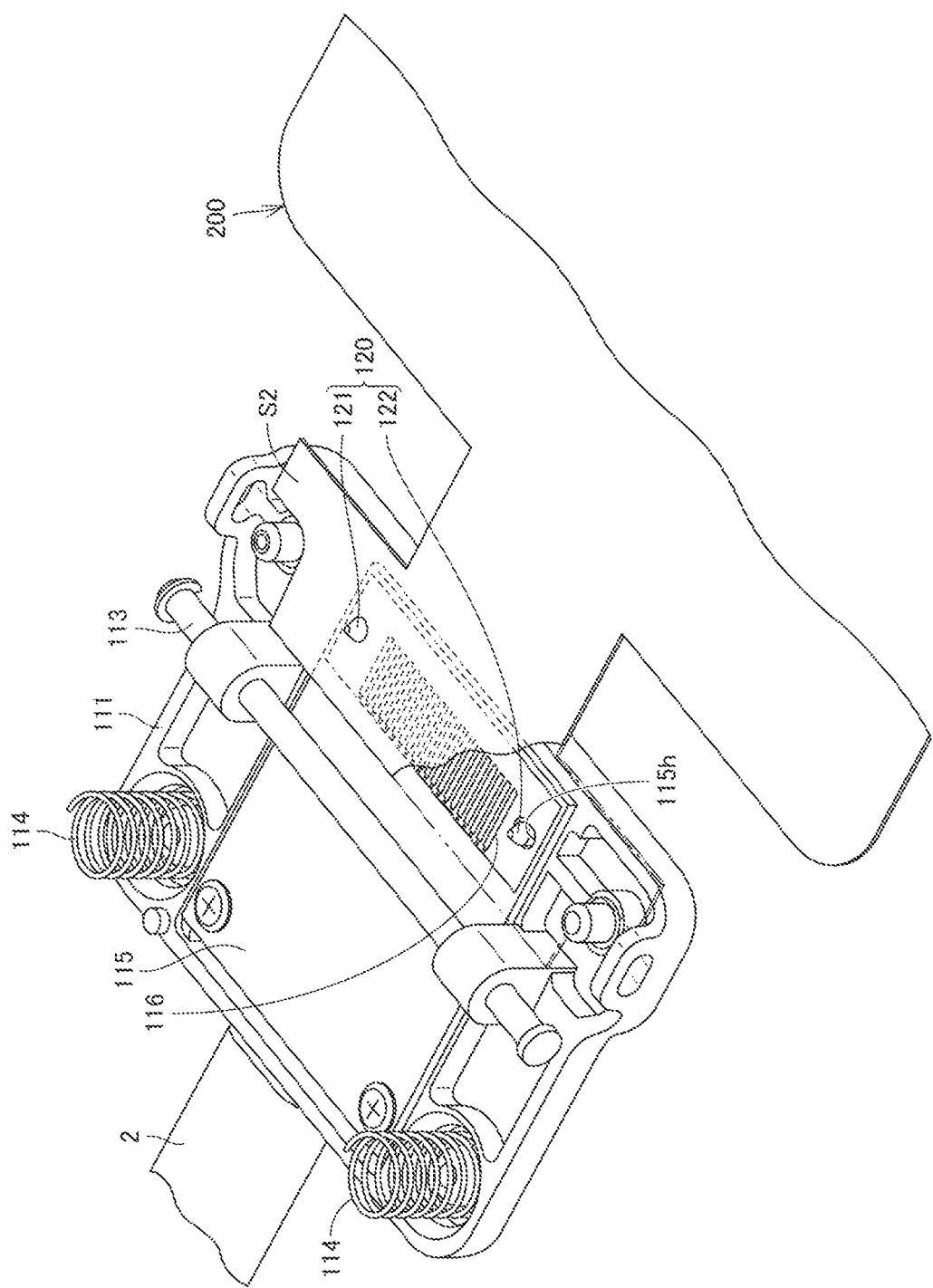
FIG. 3 is a perspective view illustrating a first body, a positioning projection, and a flexible printed circuit 200 and their relations to each other.

FIG. 1 is a perspective view illustrating a connector body being at a nipping position in a connector structure according to one embodiment of the present disclosure. FIG. 2 is a perspective view illustrating the connector body being at a releasing position in the connector structure of FIG. 1. FIG. 3 is a perspective view illustrating a first body, a positioning projection, and a flexible printed circuit 200 and their relations to each other.

Figure 4:
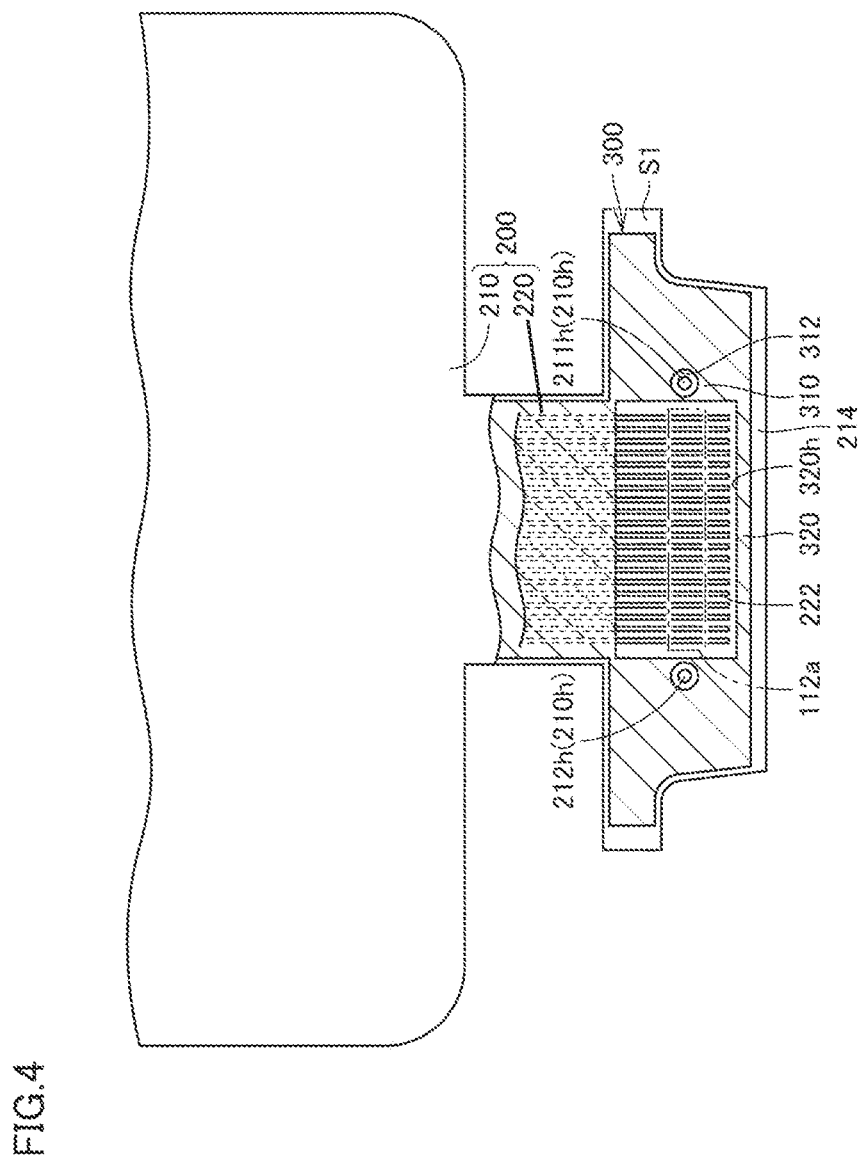
FIG. 4 is a plan view schematically illustrating the flexible printed circuit.
Figure 5:
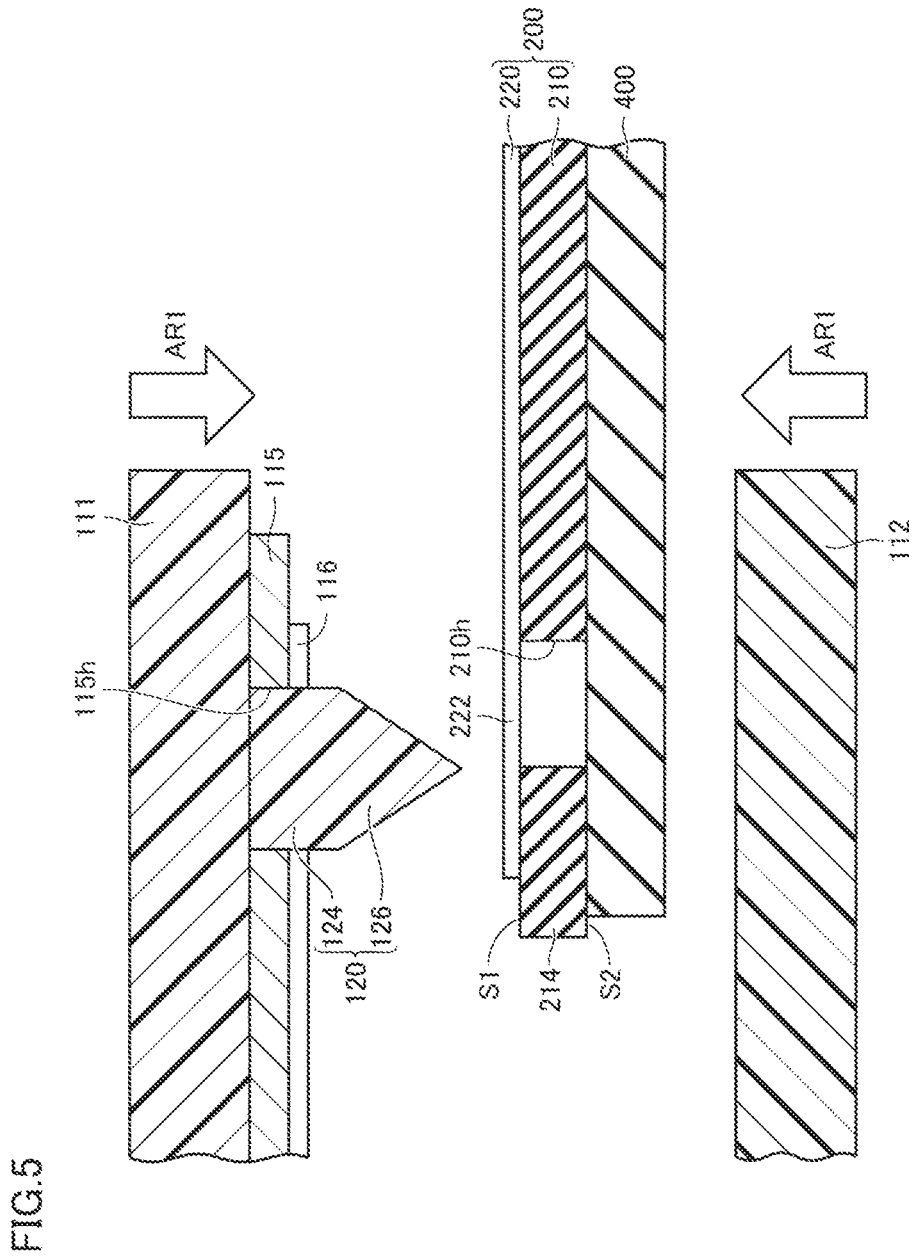
FIG. 5 is a cross-sectional view schematically illustrating a state before the flexible printed circuit is connected to the connector.
Figure 6:
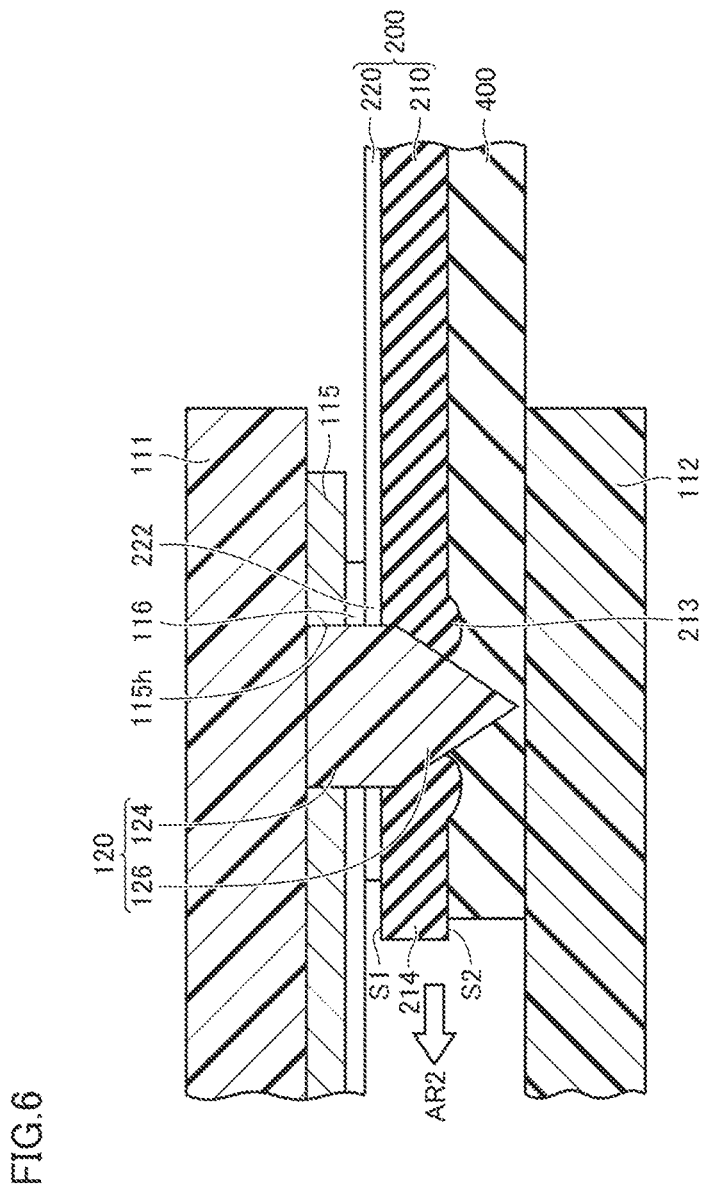
FIG. 6 is a cross-sectional view schematically illustrating a state after the flexible printed circuit is connected to the connector.

A connector structure 1 according to the present embodiment includes a connector 100, a flexible printed circuit 200, a reinforcing layer 300 (see FIG. 4), and a support member 400 (see FIGS. 5 and 6).

The connector 100 is connectable to the flexible printed circuit 200. The connector 100 includes a connector body 110 and a positioning projection 120.

The connector body 110 includes a terminal portion 116 to be connected to the flexible printed circuit 200. In the present embodiment, the connector body 110 further includes a first body 111, a second body 112, a fulcrum shaft 113, urging members 114, and a board 115 having the terminal portion 116.

As illustrated in FIG. 3, the first body 111 holds the fulcrum shaft 113. The second body 112 is held so as to be able to swing about the fulcrum shaft 113 relative to the first body 111. More specifically, the second body 112 is swingable relative to the first body 111 between a nipping position and a releasing position. In the nipping position (the position illustrated in FIG. 1), the second body 112 and the first body 111 nip the flexible printed circuit 200. In the releasing position (the position illustrated in FIG. 2), the second body 112 and the first body 111 release the flexible printed circuit 200. The second body 112 has a pressing portion 112a that presses the flexible printed circuit 200 against the first body 111.

The urging members 114 are disposed between the first body 111 and the second body 112. The urging members 114 urge the first body 111 and the second body 112 in such a manner that the second body 112 is at the nipping position relative to the first body 111. In the present embodiment, coil springs are used to serve as the urging members 114.

Consequently, a clip-like shape is formed by the first body 111, the second body 112, the fulcrum shaft 113, and the urging members 114.

As illustrated in FIG. 3, the board 115 is fixed to the first body 111. The terminal portion 116 is disposed on a surface of the board 115 in a surface region opposite to a surface region near the urging members 114 with respect to the fulcrum shaft 113. Note that in FIG. 3, the dotted lines indicate part of the terminal portion 116 that is hidden by the flexible printed circuit 200. The board 115 has a portion to be coupled to a cable 2 (see FIG. 3).

The positioning projection 120 will be described later.

FIG. 4 is a plan view schematically illustrating a flexible printed circuit. As illustrated in FIG. 4, the flexible printed circuit 200 includes an insulating layer 210 and a printed circuit portion 220.

The insulating layer 210 has one principal surface (hereinafter referred to as a "circuit surface S1") and the other principal surface (hereinafter referred to as an "opposite surface S2"). For example, the thickness of the insulating layer 210 is approximately 40 µm. The insulating layer 210 has an insertion end portion 214 that is an end portion in the insertion direction (downward direction in the image of FIG. 4) in which the flexible printed circuit is inserted between the first body 111 and the second body 112.

The printed circuit portion 220 is formed on the circuit surface S1 of the insulating layer 210. For example, the thickness of the printed circuit portion 220 is approximately 20 µm. The printed circuit portion 220 has an electrode portion 222 to be coupled to the terminal portion 116. Note that the printed circuit portion 220 includes a predetermined patterned portion to be coupled to the electrode portion 222, of which illustration is omitted.

The electrode portion 222 is formed on the circuit surface S1 of the insertion end portion 214 of the flexible printed circuit. The electrode portion 222 includes multiple electrodes disposed side by side in the orthogonal direction (right-left direction in FIG. 4) that orthogonally intersects both the thickness direction and the insertion direction of the flexible printed circuit 200.

The following describes a structure that enables the flexible printed circuit 200 to be positioned relative to the connector body 110 so as to bring the electrode portion 222 into contact with the terminal portion 116 at a predetermined right position. This structure is formed by the positioning projection 120 of the connector 100 and an insertion hole 210h formed in the insulating layer 210 of the flexible printed circuit 200.

The positioning projection 120 is a portion that can position the flexible printed circuit 200 relative to the connector body 110 so as to bring the electrode portion 222 into contact with the terminal portion 116 at the right position. As the positioning projection 120 is inserted into the insertion hole 210h, the positioning projection 120 moves the flexible printed circuit 200 so that the flexible printed circuit 200 is aligned with the right position. The positioning projection 120 projects toward the second body 112 from a portion of the first body 111 where the first body 111 opposes the second body 112.

In the present embodiment, the positioning projection 120 includes a first pin 121 and a second pin 122. In the direction parallel to the fulcrum shaft 113, the first pin 121 is disposed on the surface of the first body 111 at one side of the region that opposes the pressing portion 112a. In the direction parallel to the fulcrum shaft 113, the second pin 122 is disposed on the surface of the first body 111 at the other side of the region that opposes the pressing portion 112a. Each of the pins 121 and 122 has a base portion 124 and an insert portion 126.

The base portion 124 is shaped so as to project from the first body 111 toward the second body 112. In the present embodiment, the base portion 124 is shaped like a column.

The insert portion 126 is connected to the base portion 124. The insert portion 126 is shaped such that the external form thereof becomes smaller as the distance from the first body 111 becomes larger. In the present embodiment, the insert portion 126 is shaped like a cone. The diameter of the insert portion 126 at the end near the base portion 124 is the same as that of the base portion 124.

Note that the base portion 124 and the insert portion 126 may be, for example, shaped like a single cone.

As illustrated in FIG. 3, through holes 115h are formed through the board 115 so as to allow the positioning projection 120 to pass through. In other words, the positioning projection 120 has a function to position the board 115 with respect to the first body 111 and also has a function to position the flexible printed circuit 200 with respect to the connector body 110.

Next, the insertion hole 210h is described. As illustrated in FIG. 4, the insertion hole 210h is formed in the insulating layer 210 at a position spaced from the electrode portion 222. In the present embodiment, the insertion hole 210h includes a first hole 211h and a second hole 212h. The first hole 211h is formed in the insulating layer 210 at one side of the electrode portion 222 in the orthogonal direction. The second hole 212h is formed in the insulating layer 210 at the other side of the electrode portion 222 in the orthogonal direction. The first pin 121 and the second pin 122 are formed at such positions that outward tensile forces in the orthogonal direction can be generated to act on the electrode portion 222 when the first pin 121 and the second pin 122 are inserted into respective holes 211h and 212h. The holes 211h and 212h have circular shapes. The shapes of the holes are not limited to the circles but may be ovals or polygons. The holes 211h and 212h are smaller than the external shapes of the corresponding base portions 124 of the positioning projection 120.

The insulating layer 210 is preferably made of an elastically deformable material so as to allow the insertion hole 210h to expand when the positioning projection 120 is inserted into the insertion hole 210h. It is further preferable that the insulating layer 210 be made of the elastically deformable material so as to allow the insertion hole 210h to contract when the positioning projection 120 is disengaged from the insertion hole 210h. In the present embodiment, the insulating layer 210 is made of thermoplastic polyurethane. Note that the insulating layer 210 may be made of silicone resin or modified silicone resin.

The reinforcing layer 300 is provided to reinforce the flexible printed circuit 200. The reinforcing layer 300 has a hardness greater than that of the flexible printed circuit 200. For example, the reinforcing layer 300 may be made of an acrylic resin having a Shore D hardness of 70 or more and 80 or less. The reinforcing layer 300 may be made of urethane resin. For example, the thickness ratio of the reinforcing layer 300 to the insulating layer 210 is preferably set to be 1:1 or more and 1:4 or less, and more preferably 1:2 or more and 1:3 or less. In the present embodiment, the thickness of the reinforcing layer 300 is approximately 0.1 mm.

The reinforcing layer 300 is disposed on at least one of the circuit surface S1 and the opposite surface S2 of the insulating layer 210. In the present embodiment, the reinforcing layer 300 is disposed only on the circuit surface S1. The reinforcing layer 300 partially covers a portion of the printed circuit portion 220 excluding the electrode portion 222 so as to expose the electrode portion 222. In FIG. 4, the reinforcing layer 300 is hatched by oblique lines. In the case of the reinforcing layer 300 being formed on the opposite surface S2, the reinforcing layer 300 can be disposed at any surface region.

In the present embodiment, the reinforcing layer 300 includes a hole reinforcing portion 310 and an electrode-portion reinforcing portion 320.

The hole reinforcing portion 310 reinforces a region around the insertion hole 210h in the flexible printed circuit 200. As illustrated in FIG. 4, the hole reinforcing portion 310 has an inner peripheral surface 312 that surrounds the insertion hole 210h. In the present embodiment, the inner peripheral surface 312 is formed cylindrically. The diameter of the inner peripheral surface 312 is larger than the diameter of the insertion hole 210h and equal to or smaller than the diameter of the base portion 124.

The electrode-portion reinforcing portion 320 reinforces the electrode portion 222 of the flexible printed circuit 200. In the present embodiment, the electrode-portion reinforcing portion 320 has an exposure opening 320h that exposes the electrode portion 222. The electrode-portion reinforcing portion 320 reinforces the insertion end portion 214 of the insulating layer 210.

The support member 400 is disposed at a distal side of the flexible printed circuit 200 in the insertion direction in which the positioning projection 120 is inserted into the insertion hole 210h. In the present embodiment, as illustrated in FIGS. 5 and 6, the support member 400 is adhered to the opposite surface S2 of the flexible printed circuit 200. It is preferable that the support member 400 be shaped so as to entirely cover the opposite surface S2 of the insulating layer 210. Note that the illustration of the support member 400 is omitted in FIGS. 1 to 3. When the positioning projection 120 is inserted into the insertion hole 210h, the support member 400 supports the flexible printed circuit 200 while the support member 400 receives a portion 213 (see FIG. 6) of the flexible printed circuit 200 that bulges out in the insertion direction. The support member 400 is made of a material that deforms so as to follow the shape of the positioning projection 120 and the shape of the portion 213 of the flexible printed circuit 200 when the positioning projection 120 is inserted into the insertion hole 210h. In addition, the material deforms so as to allow the support member 400 to return to the original shape when the positioning projection 120 is disengaged from the insertion hole 210h. The support member 400 may be made of a low-resilience material (such as rubber sponge).

The following describes the operation of the connector 100 and the flexible printed circuit 200 when the flexible printed circuit 200 is connected to the connector 100.

A user manipulates (pinches) the first body 111 and the second body 112 against the urging forces of the urging members 114 so that the second body 112 is at the releasing position.

Next, the user inserts the flexible printed circuit 200 in the insertion direction until the insertion hole 210h is substantially aligned with the positioning projection 120 in the thickness direction of the flexible printed circuit 200. FIG. 5 illustrates this state.

When the user stops pinching the first body 111 and the second body 112, the urging forces of the urging members 114 cause the second body 112 to be at the nipping position. As a result, the first body 111 and the second body 112 move in directions indicated by arrows AR1 in FIG. 5.

Even if the positioning projection 120 and the insertion hole 210h are slightly out of position in the thickness direction of the flexible printed circuit 200 as illustrated in FIG. 5, the insert portion 126 presses the edge of the insulating layer 210 that defines the insertion hole 210h and thereby causes the flexible printed circuit 200 to move to the right position, as indicated by the arrow AR2 in FIG. 6, as the positioning projection 120 is inserted gradually into the insertion hole 210h. As a result, the finishing accuracy requirement of the flexible printed circuit 200 for appropriate positioning of the flexible printed circuit 200 with respect to the connector 100 can be relaxed.

Figure 7:
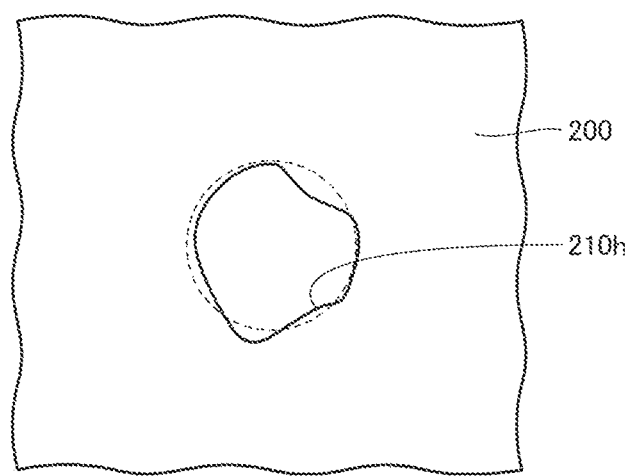
FIG. 7 is a view for explanation of accuracy of finishing an insertion hole.

When the positioning projection 120 enters the insertion hole 210h, the positioning projection 120 widens the insertion hole 210h. Accordingly, even if the shape of the insertion hole 210h is slightly deviated from the expected shape (circular shape in the present embodiment) as illustrated in FIG. 7, the positioning projection 120 moves the flexible printed circuit 200 to the right position when the positioning projection 120 enters the insertion hole 210h. Note that FIG. 6 illustrates the state after the positioning projection 120 is inserted in the insertion hole 210h.

In addition, while the flexible printed circuit 200 moves to the right position, the pressing portion 112a presses part of the electrode portion 222 located between the holes 211h and 212*h* against the terminal portion 116. This brings the electrode portion 222 into secure contact with the terminal portion 116.

Figure 8:
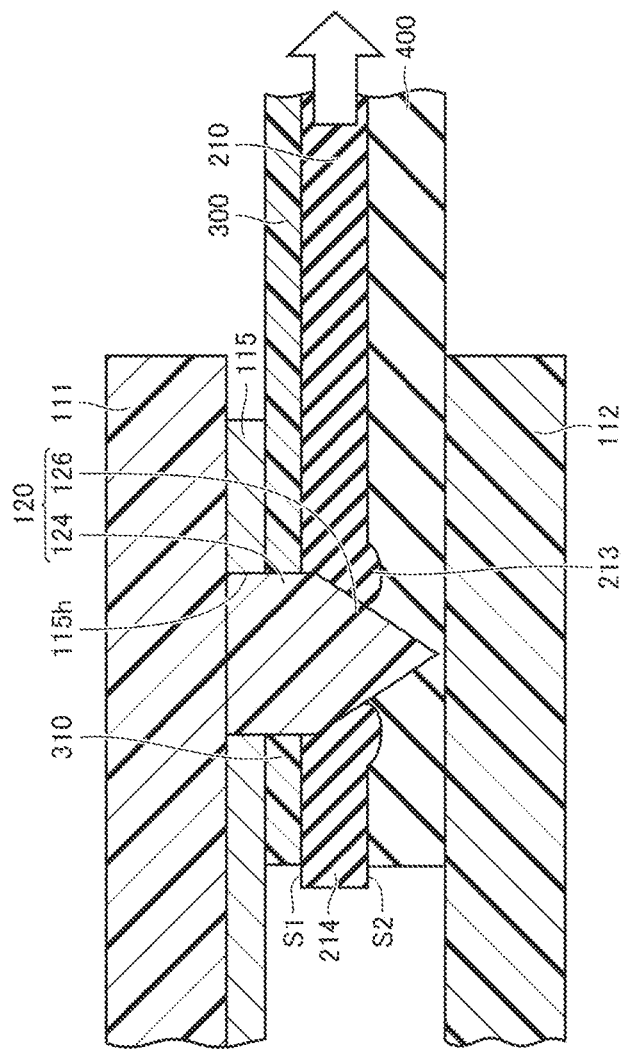
FIG. 8 is a cross-sectional view schematically illustrating a state in which an external force acts on the flexible printed circuit while the flexible printed circuit is connected to the connector.

In the connector structure 1 illustrated in FIG. 8, an external force may act on the flexible printed circuit 200 so as to displace the flexible printed circuit 200 relative to the connector 100, for example, in a direction opposite to the insertion direction of the flexible printed circuit 200 (in the direction indicated by the arrow in FIG. 8) while the positioning projection 120 is inserted in the insertion hole 210*h*. Even in this case, the abutment between the positioning projection 120 and the hole reinforcing portion 310 reduces the likelihood of the flexible printed circuit 200 being displaced relative to the connector 100, in other words, reduces the deterioration of contact between the electrode portion 222 and the terminal portion 116.

The following describes the operation of the connector 100 and the flexible printed circuit 200 when the flexible printed circuit 200 is disconnected from the connector 100.

As is the case for the connection of the flexible printed circuit 200 to the connector 100, a user first manipulates the first body 111 and the second body 112 against the urging forces of the urging members 114 so that the second body 112 is at the releasing position.

Next, the user detaches the flexible printed circuit 200 from the first body 111 and disengages the positioning projection 120 from the insertion hole 210*h*.

Figure 9:
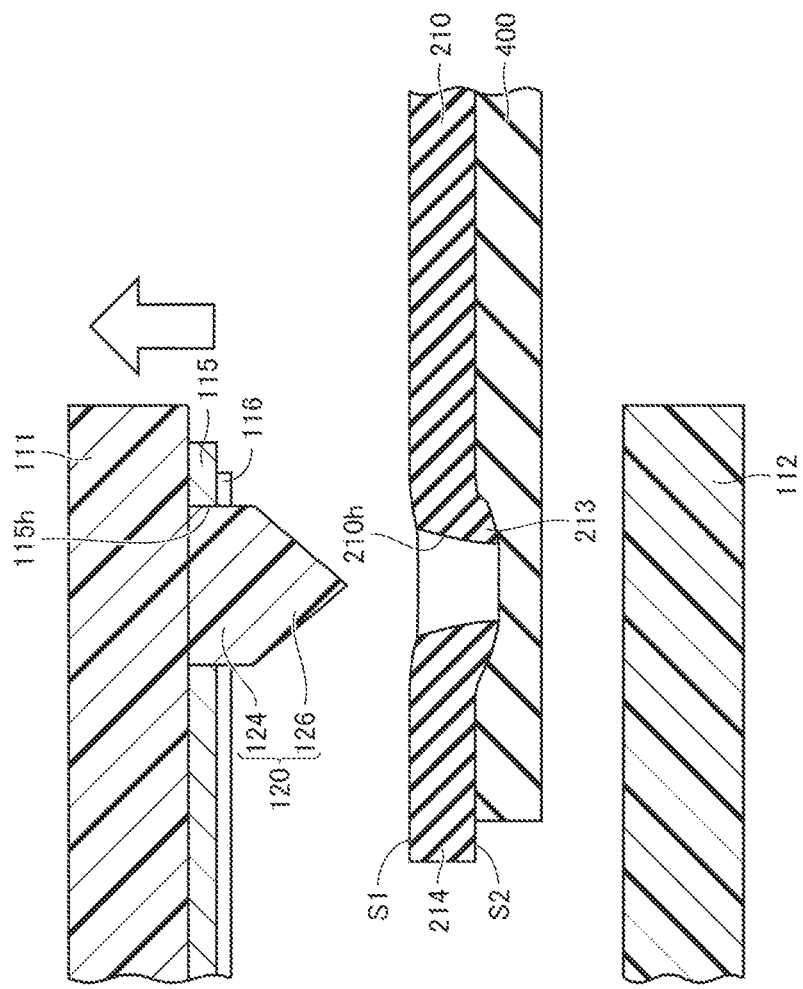
FIG. 9 is a cross-sectional view illustrating a state after the positioning projection is disengaged from the insertion hole.

Consequently, as illustrated in FIG. 9, the insertion hole 210*h* contracts such that the opening becomes smaller than the external shape of the base portion 124. In the case of the positioning projection 120 being reinserted into the insertion hole 210*h*, the positioning projection 120 widens the insertion hole 210*h* again and moves the flexible printed circuit 200 to the right position. Note that the illustration of the printed circuit portion 220 is omitted in FIG. 9.

Note that the embodiment disclosed herein should be construed as being exemplary and not as limiting in all aspects. The scope of the present disclosure is intended to be limited not by the description of the above embodiment but by the scope of the claims, in which any modifications and equivalents are included as far as not departing from the scope of the claims.

Figure 10:
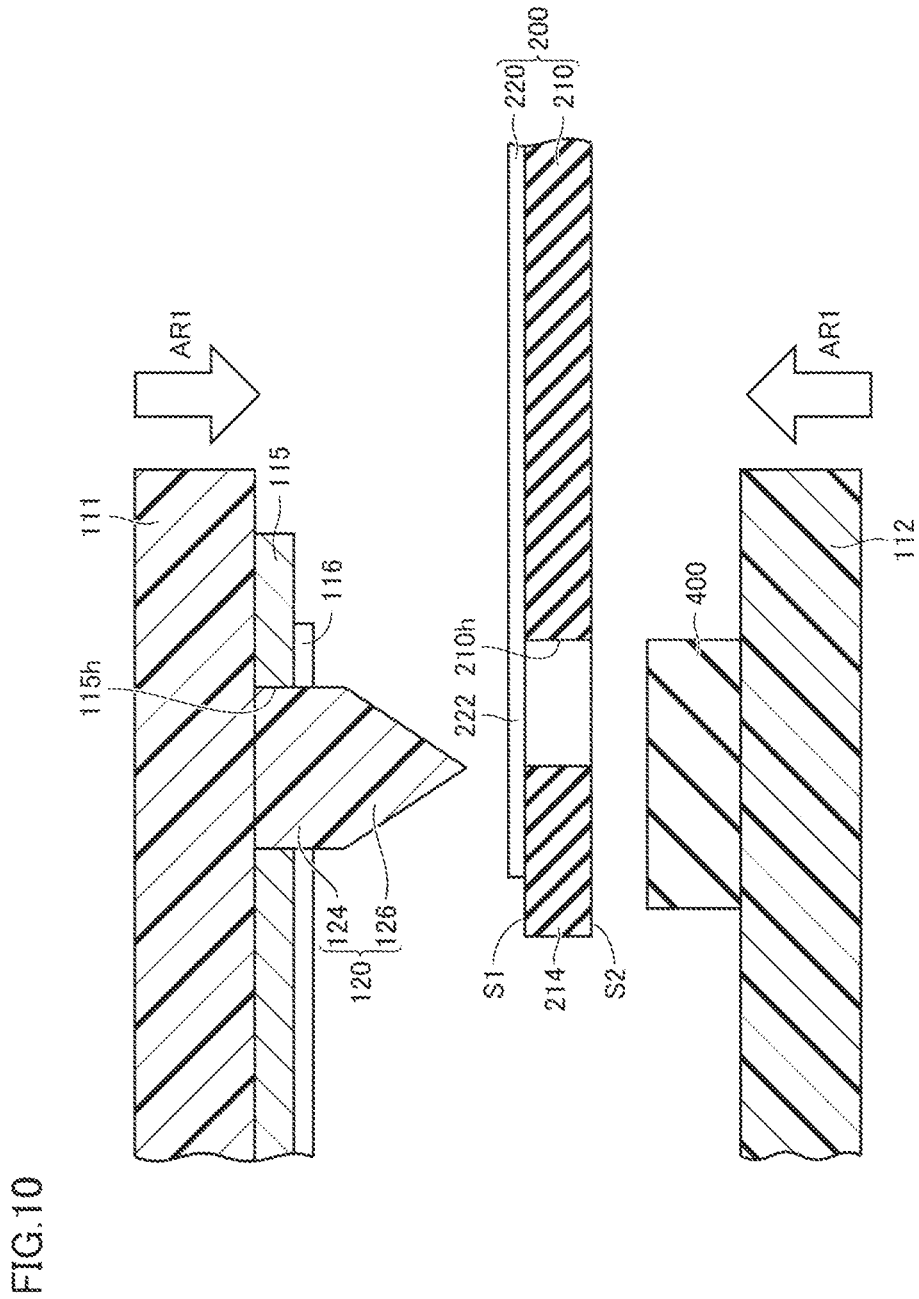
FIG. 10 is a cross-sectional view illustrating a modification example in which a support member is disposed at a different position.
Figure 11:
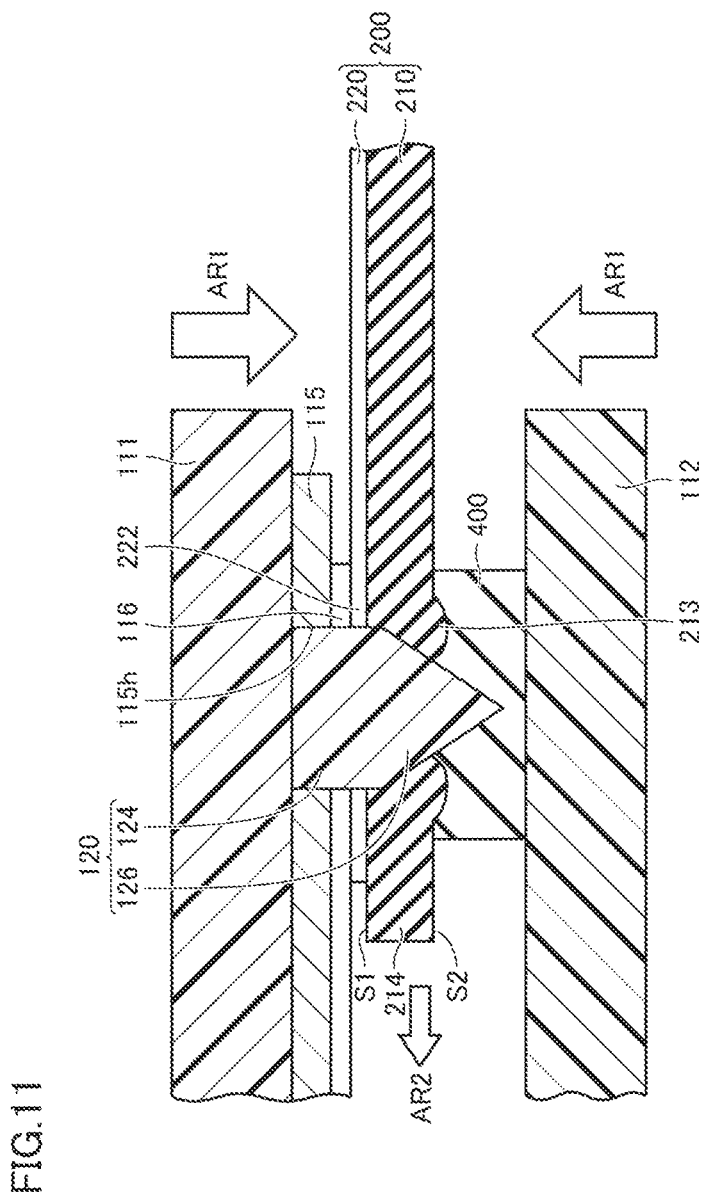
FIG. 11 is another cross-sectional view illustrating the modification example in which the support member is disposed at the different position.

For example, as illustrated in FIGS. 10 and 11, the support member 400 may be fixed to the second body 112 at a position opposing the positioning projection 120.

Figure 12:
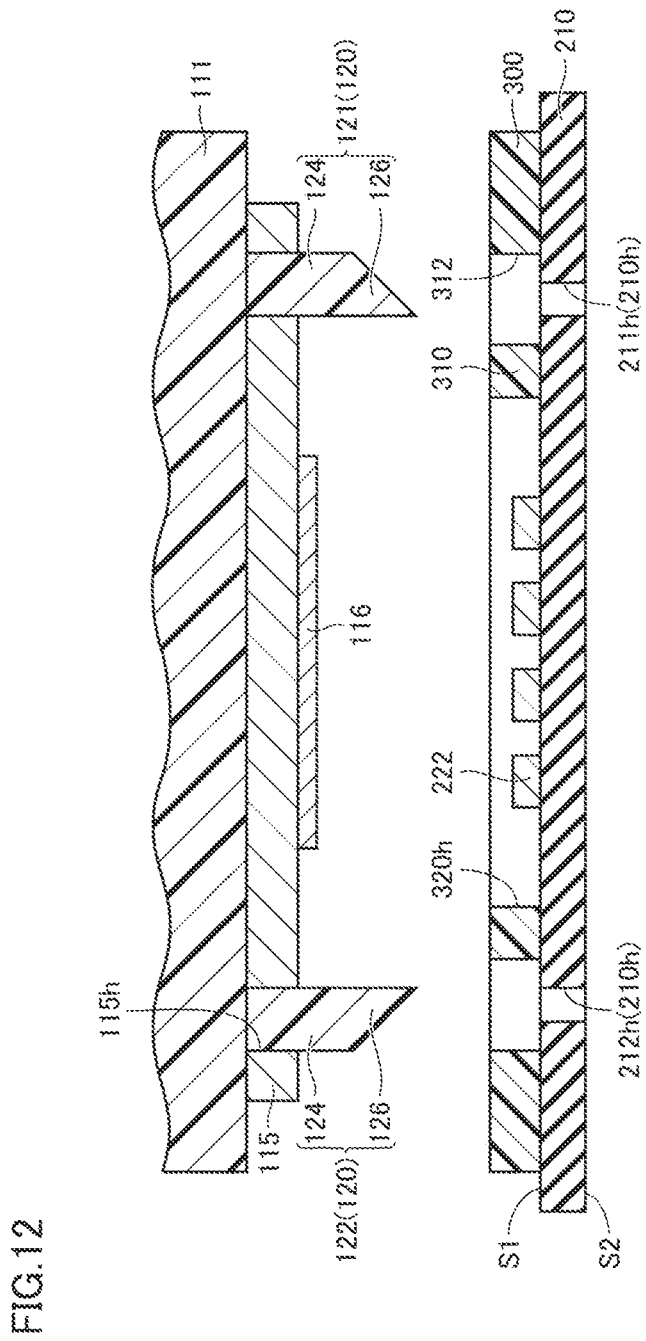
FIG. 12 is a cross-sectional view illustrating a modification example of the positioning projection.

Moreover, as illustrated in FIG. 12, the pins 121 and 122 may be shaped so as to generate outward tensile forces acting on the flexible printed circuit 200 in the orthogonal direction (in the direction in which the multiple electrodes of the electrode portion 222 are arranged side by side) as the pins 121 and 122 are inserted gradually into respective holes 211*h* and 212*h*. This reduces bending of the portion of the insulating layer 210 that supports the electrode portion 222, which can bring the electrode portion 222 into secure contact with the terminal portion 116.

The diameter of the inner peripheral surface 312 of the hole reinforcing portion 310 may be set to be larger than the diameter of the base portion 124 of the positioning projection 120. This enables the positioning projection 120 to enter the insertion hole 210*h* until the base portion 124 is positioned inside the inner peripheral surface 312. When an external force may act on the flexible printed circuit 200, for example, in a direction opposite to the insertion direction of the flexible printed circuit 200, the abutment between the inner peripheral surface 312 and the base portion 124 reduces the likelihood of the flexible printed circuit 200 being displaced in the direction opposite to the insertion direction of the flexible printed circuit 200.

Figure 13:
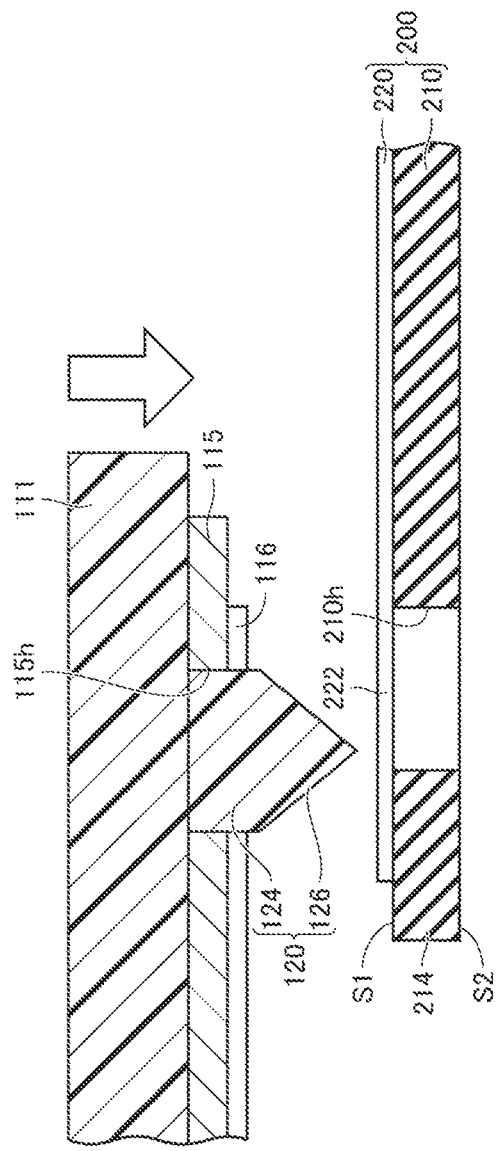
FIG. 13 is a cross-sectional view illustrating a modification example in which the insertion hole has a different size.
Figure 14:
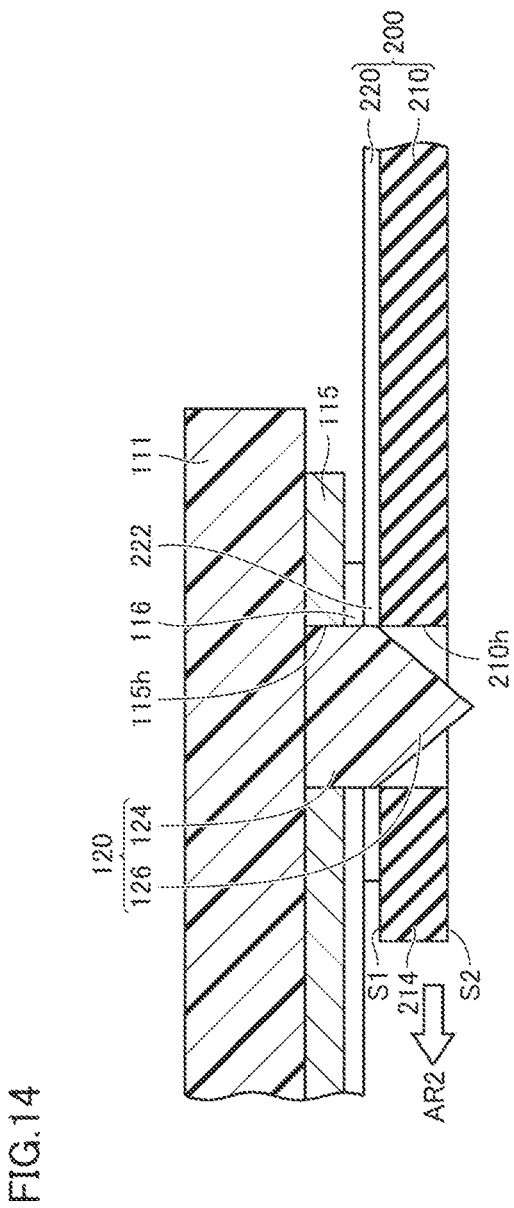
FIG. 14 is another cross-sectional view illustrating the modification example in which the insertion hole has the different size.

Moreover, as illustrated in FIGS. 13 and 14, the diameter of the insertion hole 210*h* may be set to be the same as the external shape of the base portion 124.

The configurations and advantageous effects of the connector structure 1 and the connector 100 described above are summarized as follows.

A connector structure includes a connector having a terminal portion and a flexible printed circuit having an electrode portion to be coupled to the terminal portion. The connector includes a connector body having the terminal portion. The connector also includes a positioning projection configured to position the flexible printed circuit relative to the connector body so as to bring the electrode portion into contact with the terminal portion at a right position being set in advance. An insertion hole through which the positioning projection is inserted is formed in the flexible printed circuit at a position spaced from the electrode portion. As the positioning projection is inserted gradually into the insertion hole, the positioning projection moves the flexible printed circuit so that the flexible printed circuit is aligned with the right position.

According to this connector structure, the positioning projection is configured to move the flexible printed circuit so that the flexible printed circuit is aligned with the right position as the positioning projection is inserted gradually into the insertion hole formed in the flexible printed circuit. Accordingly, the electrode portion are brought into contact with the terminal portion at the right position by mounting the flexible printed circuit onto the connector body while inserting the positioning projection into the insertion hole. As a result, the finishing accuracy requirement of the flexible printed circuit for appropriate positioning of the flexible printed circuit with respect to the connector can be relaxed.

The positioning projection preferably has a base portion connected to the connector body and an insert portion connected to the base portion, and the insert portion is preferably shaped such that an external form thereof becomes smaller as a distance from the connector body becomes larger.

The above-described advantageous effect can be obtained also with this configuration.

The insertion hole is preferably smaller than an external shape of a border portion between the base portion and the insert portion, and the flexible printed circuit is preferably elastically deformable such that the positioning projection widens the insertion hole when the positioning projection enters the insertion hole.

With this configuration, when the positioning projection is inserted into the insertion hole, the positioning projection widens the insertion hole and moves the flexible printed circuit to the right position, which compensates deviation of the insertion hole from the design position.

It is preferable that the connector structure further include a support member that is disposed at a distal side of the flexible printed circuit in an insertion direction in which the positioning projection is inserted into the insertion hole. When the positioning projection is inserted into the insertion hole, the support member supports the flexible printed circuit while the support member receives a portion of the flexible printed circuit that bulges out in the insertion direction.

With this configuration, the support member supports the flexible printed circuit while the support member receives the portion (bulging portion) of the flexible printed circuit that bulges out in the insertion direction. Accordingly, the support member reduces the deformation of the flexible printed circuit that bulges out in the insertion direction of the positioning projection while allowing the insertion hole to expand so as to receive the positioning projection appropriately when the positioning projection is inserted into the insertion hole.

It is preferable that the flexible printed circuit be elastically deformable such that the insertion hole contracts when the positioning projection is disengaged from the insertion hole.

With this configuration, the insertion hole contracts after the positioning projection is disengaged from the insertion hole. In the case of the positioning projection being reinserted into the insertion hole, the positioning projection widens the insertion hole again and moves the flexible printed circuit to the right position.

The connector structure may further include a hole reinforcing portion that reinforces a region around the insertion hole in the flexible printed circuit. In this case, the hole reinforcing portion preferably has an inner peripheral surface that surrounds the insertion hole, and the inner peripheral surface is preferably formed so as to be larger than the insertion hole and so as to be equal to or smaller than an external shape of the positioning projection.

With this configuration, the hole reinforcing portion reduces the relative displacement of the positioning projection with respect to the hole reinforcing portion. In addition, even if an external force acts on the flexible printed circuit so as to displace the flexible printed circuit relative to the connector in a direction orthogonal to the thickness direction thereof, the abutment between the positioning projection and the hole reinforcing portion reduces the displacement of the flexible printed circuit relative to the connector.

In this case, it is also preferable that the flexible printed circuit include an insulating layer having a circuit surface at which the electrode portion is formed and that the flexible printed circuit also include a printed circuit portion formed on the circuit surface and including the electrode portion. In addition, the hole reinforcing portion is preferably disposed at the circuit surface.

With this configuration, the printed circuit portion and the hole reinforcing portion can be formed on the insulating layer in the same manufacturing process.

In addition, it is preferable that the connector structure further include an electrode-portion reinforcing portion that reinforces the electrode portion.

With this configuration, the electrode portion can be connected stably to the connector body.

The electrode portion may have multiple electrodes disposed side by side in an orthogonal direction that orthogonally intersects a thickness direction of the flexible printed circuit. The insertion hole may include a pair of holes formed at both sides of the electrode portion in the orthogonal direction, and the positioning projection may include a pair of pins to be inserted into respective holes. In this case, the pins are preferably formed at such positions that outward tensile forces in the orthogonal direction are generated to act on the electrode portion when the pins are inserted into respective holes.

This reduces bending of the electrode portion, which can bring the electrode portion into secure contact with the terminal portion.

In addition, the connector body may include a first body and a second body that are configured to nip the electrode portion in a thickness direction of the electrode portion and may also include a board that is fixed to one of the first body and the second body at a position opposing the other body and that has the terminal portion. In this case, the positioning projection is preferably connected to the first body at a position opposing the second body, and the first body and the second body preferably nip the board and the flexible printed circuit so as to bring the electrode portion and the terminal portion into contact with each other in a state of the positioning projection being inserted in the insertion hole.

A connector is to be coupled to a flexible printed circuit that has an electrode portion and an insertion hole formed at a position spaced from the electrode portion. The connector includes a connector body having a terminal portion to be coupled to the electrode portion and a positioning projection configured to position the flexible printed circuit relative to the connector body so as to bring the electrode portion into contact with the terminal portion at a right position being set in advance. As the positioning projection is inserted gradually into the insertion hole, the positioning projection moves the flexible printed circuit so that the flexible printed circuit is aligned with the right position.

In addition, the connector body may include a board having the terminal portion and a body that holds the board. In this case, the board preferably has through holes through which the positioning projection is to be inserted, and the positioning projection is preferably connected to the body at a position at which the positioning projection is insertable into the through hole of the board that is held by the body.

With this configuration, the positioning projection has a function to position the flexible printed circuit relative to the connector body and also has a function to position the board relative to the body, which leads to simplification of the structure of the connector compared with a case in which a dedicated member is provided for positioning the board relative to the body.

1 connector structure
2 cable
100 connector
110 connector body
111 first body
112 second body
113 fulcrum shaft
114 urging member
115 board
115$h$ through hole
116 terminal portion
120 positioning projection
121 first pin
122 second pin
124 base portion
126 insert portion
200 flexible printed circuit
210 insulating layer
210$h$ insertion hole
211$h$ first hole
212$h$ second hole
214 insertion end portion
220 printed circuit portion
222 electrode portion
300 reinforcing layer
310 hole reinforcing portion
312 inner peripheral surface
320 electrode-portion reinforcing portion
320$h$ exposure opening
400 support member
S1 circuit surface
S2 opposite surface

The invention claimed is:

1. A connector structure, comprising:
a connector having a terminal portion; and
a flexible printed circuit having an electrode portion to be coupled to the terminal portion, wherein
the connector includes
a connector body having the terminal portion, and
a positioning projection configured to position the flexible printed circuit relative to the connector body so as to bring the electrode portion into contact with the terminal portion at a right position being set in advance,
an insertion hole through which the positioning projection is inserted is provided in the flexible printed circuit at a position spaced from the electrode portion, and
as the positioning projection is inserted gradually into the insertion hole, the positioning projection is configured to move the flexible printed circuit so that the flexible printed circuit is aligned with the right position,
wherein the positioning projection has
a base portion connected to the connector body, and
an insert portion connected to the base portion, and
the insert portion is shaped such that an external form of the insert portion becomes smaller as a distance from the connector body becomes longer,
wherein
the insertion hole is smaller than an external shape of a border portion between the base portion and the insert portion, and
the flexible printed circuit is elastically deformable such that the positioning projection widens the insertion hole when the positioning projection enters the insertion hole.

2. The connector structure according to claim 1, further comprising:
a support member disposed at a distal side of the flexible printed circuit in an insertion direction in which the positioning projection is inserted into the insertion hole, wherein
when the positioning projection is inserted into the insertion hole, the support member supports the flexible printed circuit while the support member receives a portion of the flexible printed circuit bulging out in the insertion direction.

3. The connector structure according to claim 1, wherein the flexible printed circuit is elastically deformable such that the insertion hole contracts when the positioning projection is disengaged from the insertion hole.

4. The connector structure according to claim 1, further comprising:
a hole reinforcing portion configured to reinforce a region around the insertion hole in the flexible printed circuit, wherein
the hole reinforcing portion has an inner peripheral surface surrounding the insertion hole, and
the inner peripheral surface is provided so as to be larger than the insertion hole and so as to be equal to or smaller than an external shape of the positioning projection.

5. The connector structure according to claim 4, wherein the flexible printed circuit includes
an insulating layer having a circuit surface on which the electrode portion is provided, and
a printed circuit portion provided on the circuit surface and including the electrode portion, and
the hole reinforcing portion is disposed on the circuit surface.

6. The connector structure according to claim 1, further comprising:
an electrode-portion reinforcing portion configured to reinforce the electrode portion.

7. A connector structure comprising
a connector having a terminal portion; and
a flexible printed circuit having an electrode portion to be coupled to the terminal portion, wherein
the connector includes
a connector body having the terminal portion, and
a positioning projection configured to position the flexible printed circuit relative to the connector body so as to bring the electrode portion into contact with the terminal portion at a right position being set in advance,
an insertion hole through which the positioning projection is inserted is provided in the flexible printed circuit at a position spaced from the electrode portion, and
as the positioning projection is inserted gradually into the insertion hole, the positioning projection is configured to move the flexible printed circuit so that the flexible printed circuit is aligned with the right position,
wherein
the electrode portion has multiple electrodes disposed side by side in an orthogonal direction orthogonally intersecting a thickness direction of the flexible printed circuit,
the insertion hole includes a pair of holes provided at both sides of the electrode portion in the orthogonal direction,
the positioning projection includes a pair of pins to be inserted into respective holes, and
the pins are provided at such positions that outward tensile forces in the orthogonal direction are generated to act on the electrode portion when the pins are inserted into the respective holes.

8. A connector structure comprising
a connector having a terminal portion; and
a flexible printed circuit having an electrode portion to be coupled to the terminal portion, wherein
the connector includes
a connector body having the terminal portion, and
a positioning projection configured to position the flexible printed circuit relative to the connector body so as to bring the electrode portion into contact with the terminal portion at a right position being set in advance,
an insertion hole through which the positioning projection is inserted is provided in the flexible printed circuit at a position spaced from the electrode portion, and
as the positioning projection is inserted gradually into the insertion hole, the positioning projection is configured to move the flexible printed circuit so that the flexible printed circuit is aligned with the right position,
wherein
the connector body includes
a first body and a second body configured to nip the electrode portion in a thickness direction of the electrode portion, and
a board fixed to one of the first body and the second body at a position opposing the other body and having the terminal portion,
the positioning projection is connected to the first body at a position opposing the second body, and
the first body and the second body are configured to nip the board and the flexible printed circuit so as to bring the electrode portion and the terminal portion into contact with each other in a state of the positioning projection being inserted in the insertion hole.

9. The connector structure according to claim 2, wherein the flexible printed circuit is elastically deformable such that the insertion hole contracts when the positioning projection is disengaged from the insertion hole.

10. The connector structure according to claim 2, further comprising:
   a hole reinforcing portion configured to reinforce a region around the insertion hole in the flexible printed circuit, wherein
   the hole reinforcing portion has an inner peripheral surface surrounding the insertion hole, and
   the inner peripheral surface is provided so as to be larger than the insertion hole and so as to be equal to or smaller than an external shape of the positioning projection.

11. The connector structure according to claim 3, further comprising:
   a hole reinforcing portion configured to reinforce a region around the insertion hole in the flexible printed circuit, wherein
   the hole reinforcing portion has an inner peripheral surface surrounding the insertion hole, and
   the inner peripheral surface is provided so as to be larger than the insertion hole and so as to be equal to or smaller than an external shape of the positioning projection.

12. The connector structure according to claim 1, further comprising:
   an electrode-portion reinforcing portion configured to reinforce the electrode portion.

13. The connector structure according to claim 2, further comprising:
   an electrode-portion reinforcing portion configured to reinforce the electrode portion.

14. The connector structure according to claim 3, further comprising:
   an electrode-portion reinforcing portion configured to reinforce the electrode portion.

* * * * *